United States Patent
Jiang et al.

(10) Patent No.: US 9,891,463 B2
(45) Date of Patent: Feb. 13, 2018

(54) MASK FOR FORMING COLOR FILTER LAYER, METHOD FOR FABRICATING COLOR FILTER SUBSTRATE, AND COLOR FILTER SUBSTRATE

(71) Applicants: BOE TECHNOLOGY GROUP CO., LTD., Beijing (CN); BEIJING BOE DISPLAY TECHNOLOGY CO., LTD., Beijing (CN)

(72) Inventors: Jingjing Jiang, Beijing (CN); Min Li, Beijing (CN); Hongjiang Wu, Beijing (CN); Yu Xiao, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 802 days.

(21) Appl. No.: 14/381,527

(22) PCT Filed: Jun. 14, 2013

(86) PCT No.: PCT/CN2013/077252
§ 371 (c)(1),
(2) Date: Aug. 27, 2014

(87) PCT Pub. No.: WO2014/134884
PCT Pub. Date: Sep. 12, 2014

(65) Prior Publication Data
US 2016/0195762 A1    Jul. 7, 2016

(30) Foreign Application Priority Data
Mar. 6, 2013    (CN) .......................... 2013 1 0071229

(51) Int. Cl.
*G02F 1/1339*    (2006.01)
*G02F 1/1335*    (2006.01)
(Continued)

(52) U.S. Cl.
CPC .... *G02F 1/133516* (2013.01); *G02F 1/13394* (2013.01); *G03F 1/50* (2013.01); *G03F 7/0007* (2013.01); *G02F 2001/13396* (2013.01)

(58) Field of Classification Search
CPC ......... G03F 7/0007; G02B 5/20; G02B 5/201; G02B 5/223; G02F 1/133514; G02F 1/133516; G02F 1/13394
(Continued)

(56) References Cited

U.S. PATENT DOCUMENTS 7,423,710 B2    9/2008    Lee et al.
2005/0019679 A1*    1/2005    Lo .......................... G02B 5/201
                                                                    430/7
(Continued)

FOREIGN PATENT DOCUMENTS

CN    1797117 A    7/2006
CN    101004525 A    7/2007
(Continued)

OTHER PUBLICATIONS

Computer-generated translation of JP 2008-310332 (Dec. 2008).*
(Continued)

*Primary Examiner* — John A McPherson
(74) *Attorney, Agent, or Firm* — Ladas & Parry LLP

(57) ABSTRACT

A mask for forming color filter layer, a method for fabricating a color filter substrate and a color filter substrate are provided. A light regulating structure is disposed in a portion of a transparent region of the mask for forming color filter layer, and the light regulating structure is disposed at a position corresponding to a base of a columnar spacer above the color filter layer.

14 Claims, 3 Drawing Sheets

(51) Int. Cl.
*G03F 1/50* (2012.01)
*G03F 7/00* (2006.01)

(58) Field of Classification Search
USPC .................................. 430/7; 349/106, 156
See application file for complete search history.

(56) References Cited

U.S. PATENT DOCUMENTS

| | | | |
|---|---|---|---|
| 2005/0140858 | A1 | 6/2005 | Park |
| 2006/0139515 | A1 | 6/2006 | Baek |
| 2007/0159588 | A1* | 7/2007 | Yoon ............... G02F 1/13306 349/156 |
| 2007/0238034 | A1 | 10/2007 | Holscher, Jr. |
| 2012/0268702 | A1* | 10/2012 | Imanishi ............ G02F 1/13394 349/124 |

FOREIGN PATENT DOCUMENTS

| | | | |
|---|---|---|---|
| CN | 101324750 | A | 12/2008 |
| CN | 102819180 | A | 12/2012 |
| CN | 103135334 | A | 6/2013 |
| JP | 2007-171624 | A | 7/2007 |
| JP | 2008-310332 | A * | 12/2008 |
| JP | 2011-145377 | A | 7/2011 |
| KR | 20040104799 | A | 12/2004 |
| KR | 20070064923 | A | 6/2007 |

OTHER PUBLICATIONS

International Preliminary Report on Patentability Appln. No. PCT/CN2013/077536; dated Sep. 1, 2015.
International Search Report Appln. No. PCT/CN2013/077252; dated Nov. 28, 2013.
Chinese Patent Certificate Appln. No. 201310071229.X; Dated Jun. 17, 2015.

* cited by examiner

B-B'

B-B'

MASK FOR FORMING COLOR FILTER LAYER, METHOD FOR FABRICATING COLOR FILTER SUBSTRATE, AND COLOR FILTER SUBSTRATE

TECHNICAL FIELD

Embodiments of the disclosure relate to a color filter substrate of a thin film transistor liquid crystal display, more particularly, to a mask for forming color filter layer, a method for fabricating a color filter substrate, and a color filter substrate.

BACKGROUND

With development of display technology, display with high resolution, large size and high image quality has become a goal pursued in a display field. A color filter substrate as a major component of a liquid crystal display device has its design more and more sophisticated and its requirements on fabrication accuracy much higher.

Shortcomings of the prior art mainly lay in that: all of the color filter layers are formed by curing liquid photoresist. Due to fluidity of liquid photoresist and a height difference between a black matrix and both sides thereof, in spite of presence of a protection layer, a surface of a base of a columnar spacer is not flat at all, which is especially obvious in a direction where the black matrix is narrower, as shown in sectional view in FIG. 3. Therefore, after the columnar spacer is fabricated, the shape and surface morphology of the base will change, and dimensions in all directions are not uniform, which thereby affects a supporting effect of the columnar spacer during assembling the color filter substrate with an array substrate. In addition, nonuniform force will also affect the display effect, and reduce the image quality. In particular, as the resolution becomes higher, demand for narrowing the black matrix becomes increasingly obvious, difference in flatness of the base of the columnar spacer will increase, and a problem of columnar spacer deformation will also be more and more prominent.

In addition, at present, in order to minimize deformation of the columnar spacer, it is necessary to provide the columnar spacer on the black matrix and at a center position of a region corresponding to a gate line on the TFT array substrate and the size of the columnar spacer should not be too large, and thus the design of the columnar spacer is limited.

To solve the above problems, the disclosure makes some improvements.

SUMMARY

Embodiments of the disclosure provide a mask for forming color filter layer used in a fabrication process of a color filter substrate. A light regulating structure is disposed in a portion of a transparent region of the mask for forming color filter layer, and the light regulating structure is disposed at a position corresponding to a base of a columnar spacer above the color filter layer.

For example, the light regulating structure is a slit structure, the slit structure comprises one slit or a plurality of slits disposed parallel to each other, and each slit is provided in a direction perpendicular to a length direction of the transparent region.

For example, in the case that the slit structure comprises three or more slits, a slit width from both sides to a center of the light regulating structure decreases progressively, and/or a distance between the slits increases progressively from both sides to the center of the light regulating structure.

For example, in the case that the slit structure comprises three or more slits, the slit width from both sides to a center of the light regulating structure increases progressively, and/or the distance between the slits decreases progressively from both sides to the center of the light regulating structure.

For example, the light regulating structure is a translucent film structure.

For example, a transmittance of the translucent film structure decreases progressively from both sides to a center along the length direction of the transparent region, or a transmittance of the translucent film structure increases progressively from both sides to the center along the length direction of the transparent region.

Embodiments of the disclosure further provide a method for fabricating a color filter substrate by using the above-described mask for forming color filter layer. The method comprises: S1: in an exposure process of the color filter layer, regulating an exposure degree of a portion of the color filter layer corresponding to the base of the columnar spacer by the light regulating structure in the mask for forming color filter layer, so as to form the color filter substrate.

For example, prior to the step S1, the color filter layer is formed on a black matrix in a shape of stripe or island.

For example, in the step S1, the portion of the color filter layer corresponding to the base of the columnar spacer is exposed by a slit structure or a translucent film structure which is provided in the mask for forming color filter layer and corresponds to the base of the columnar spacer.

Embodiments of the disclosure further provide a color filter substrate. The color filter substrate comprises a protection layer and a columnar spacer. The columnar spacer is disposed on the protection layer and corresponds to a portion of a gate line on an array substrate, and a base of the columnar spacer on the protection layer is disposed in a flat shape.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure. The following embodiments are used to illustrate the disclosure, but not to limit the scope thereof.

Figure 1:
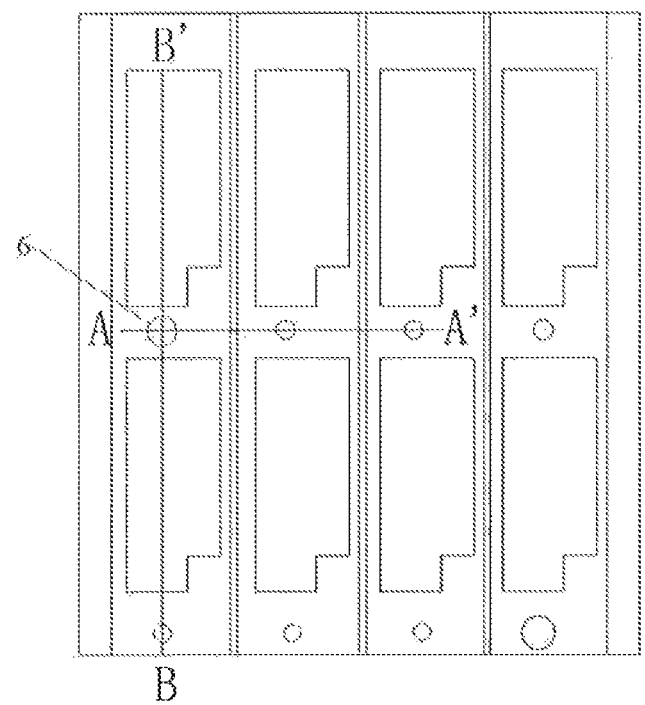
FIG. 1 is a structural view illustrating a color filter substrate.
Figure 2:
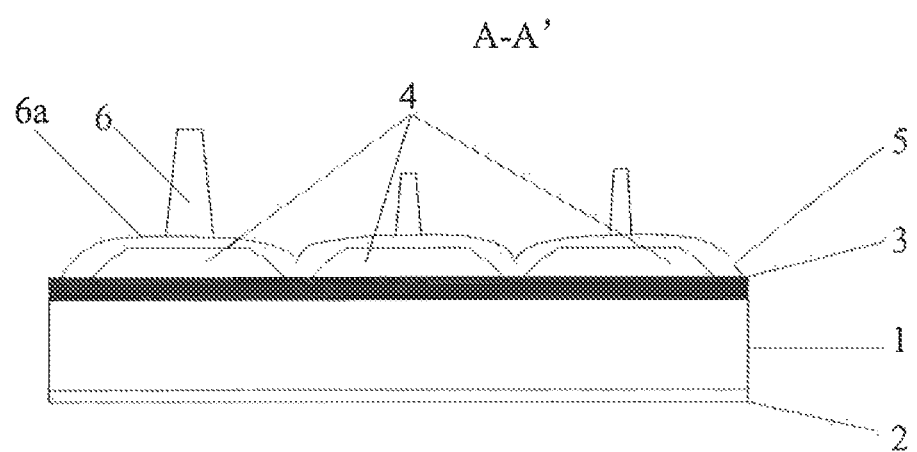
FIG. 2 is a sectional view taken along line A-A' of FIG. 1.
Figure 3:
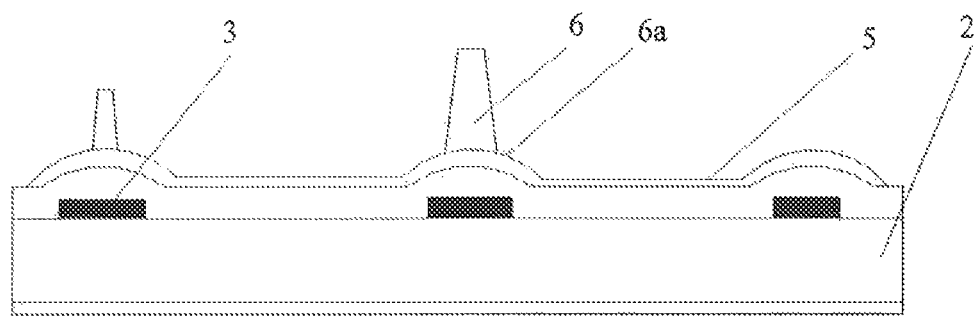
FIG. 3 is a sectional view taken along line B-B' of FIG. 1.
Figure 4:
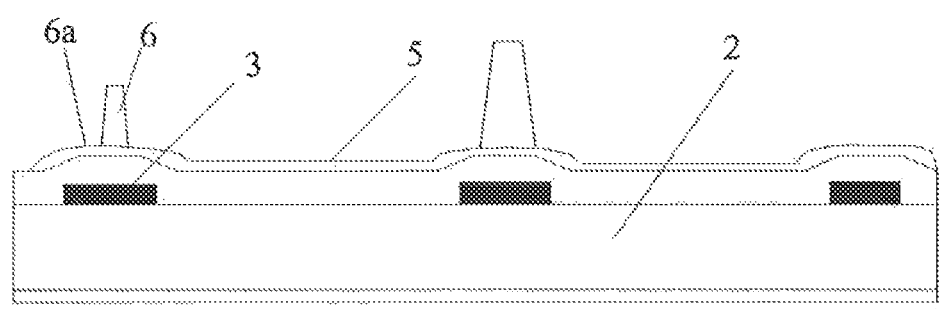
FIG. 4 is a sectional view illustrating a color filter substrate according to the embodiments of the disclosure, which is taken along line B-B'.
Figure 5:
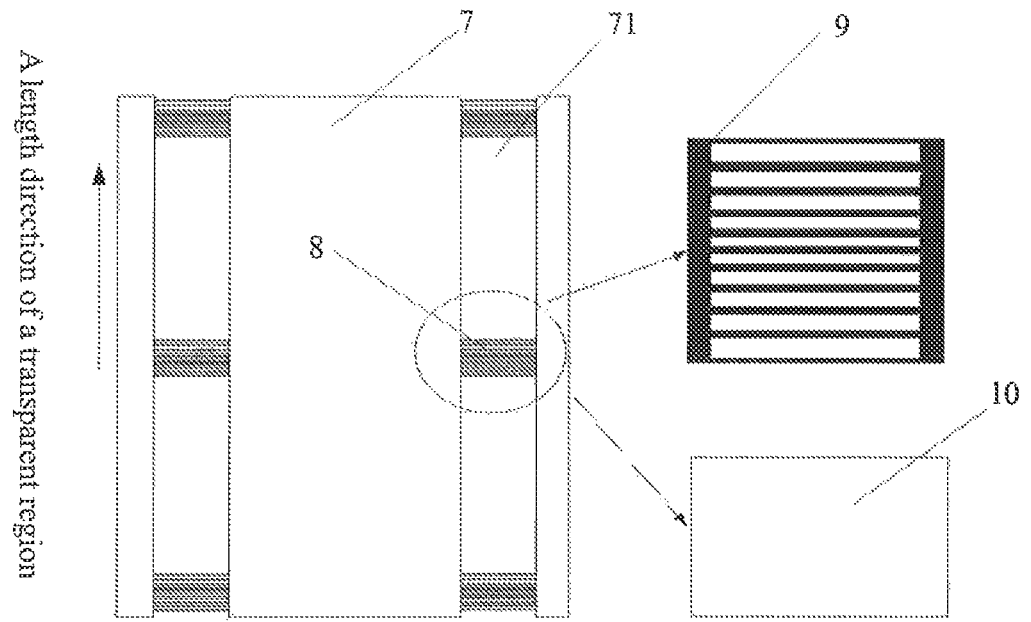
FIG. 5 is a structural view illustrating a mask for forming color filter layer according to the embodiments of the disclosure.

As shown in FIG. 1, FIG. 2 and FIG. 3 (with an FFS mode as an example), a color filter substrate mainly comprises a substrate 1 for example made of glass, an ITO film 2 provided on a rear side of the substrate 1, a black matrix 3, a color filter layer 4, a protection layer 5 and a columnar spacer 6. The columnar spacer 6 is disposed above the color filter layer 4 and is located at a position corresponding to a portion of a gate line on a Thin Film Transistor (TFT) array substrate. The color filter substrate and the array substrate are assembled to form a display device. The larger the size of the display device is, the larger the size of the columnar spacer is (the columnar spacer plays a major supporting role and is designed according to the practical needs). Nonuniform force applied to all directions of the columnar spacer will affect the display effect and reduce the image quality. Particularly, as the resolution becomes higher, demand for narrowing the black matrix becomes increasingly obvious, difference in flatness of a base of the columnar spacer 6 in a direction perpendicular to the gate line on the TFT array substrate (a B-B' direction as shown in FIG. 3) will increase, and a problem of columnar spacer deformation will also be more and more prominent As shown in FIG. 5, the embodiments of the disclosure provide a mask 7 for forming color filter layer, which is used in a fabrication process of the color filter substrate. A light regulating structure 8 for regulating light passing through thereof is disposed in a portion of a transparent region 71 of the mask for forming color filter layer and the portion of the transparent region 71 corresponds to a portion of the gate line on the array substrate. In addition, the light regulating structure is disposed at a position corresponding to a base of the columnar spacer above the color filter layer. As shown in FIG. 4, the columnar spacer 6 is disposed above the color filter layer on the black matrix 3 and corresponds to a portion of the gate line on the array substrate. By using the light regulating structure, exposure degree of the portion of the color filter layer corresponding to the light regulating structure, i.e., exposure degree of the base of the columnar spacer 6a, is reduced, so that the base of the columnar spacer becomes flat and the flatness of the base of the columnar spacer is improved. Since the columnar spacer is disposed on the base with the improved flatness, the effect of the shape and surface morphology of the color filter layer on the columnar spacer is reduced and a greater design room for the columnar spacer is provided.

The light regulating structure may comprise various structures, such as a mesh structure. The embodiments of the disclosure take the following two structures as examples. The two structures are a slit structure 9 and a translucent film structure 10. The slit structure 9 comprises one slit or a plurality of slits disposed parallel to each other, and each slit is provided in a direction perpendicular to a length direction of the transparent region. In the case that the slit structure comprises three or more slits, if photoresist for forming the color filter layer (for example, red, green and blue color filter layer) used in the fabrication process of the color filter substrate is a negative photoresist, as shown in FIG. 5, a slit width from both sides to the center of the light regulating structure decreases progressively, and/or a distance between the slits increases progressively from both sides to the center of the light regulating structure. If the photoresist for forming the color filter layer is a positive photoresist, the slit width from both sides to the center of the light regulating structure increases progressively, and/or the distance between the slits decreases progressively from both sides to the center of the light regulating structure. The slit width is generally less than 5 μm, and the slit width that can be implemented relates to the nature of the material per se. The number and interval of the slits are designed according to different products. The translucent film structure 10 is shown in FIG. 5 as well. If the photoresist for forming the color filter layer is the negative photoresist, a transmittance of the translucent film structure decreases progressively from both sides to the center along the length direction of the transparent region; if the photoresist for forming the color filter layer is the positive photoresist, the transmittance of the translucent film structure increases progressively from both sides to the center along the length direction of the transparent region. Different transmittances (0-100%) are designed according to practical requirements and the nature of the used material per se. By using the above-described mask for forming color filter layer, the light transmittance of the light regulating structure can be uniformly regulated.

The embodiments of the disclosure further provide a method for fabricating the color filter substrate using the above-described mask for forming color filter layer. The method comprises the following steps.

S1. In an exposure process of the color filter layer, an exposure degree of a portion of the color filter layer corresponding to the base of the columnar spacer is regulated by the light regulating structure in the mask for forming color filter layer. In addition, prior to this step, the color filter layer is formed on the black matrix in a shape of stripe or island. In this way, the formation of the columnar spacer is facilitated. Moreover, in this step, the color filter layer for example is formed of the positive or negative photoresist. After the color filter layer is exposed, the color filter layer is developed.

In the step S1, for example, the portion of the color filter layer corresponding to the base of the columnar spacer is exposed by the slit structure which is provided in the mask for forming color filter layer and corresponds to the base of the columnar spacer; or the portion of the color filter layer corresponding to the base of the columnar spacer is exposed by the translucent film structure which is provided in the mask for forming color filter layer and corresponds to the base of the columnar spacer. In this way, the base of the columnar spacer will become flatter.

S2. after the color filter layer is formed, the columnar spacer is formed on the base thereof, and the columnar spacer is disposed above the color filter layer and corresponds to a portion of the gate line on the array substrate. Thus, the fabrication of the color filter substrate is completed. Since the base of the columnar spacer becomes flatter as described above, the precision of the columnar spacer is ensured.

The embodiments of the disclosure further provide a color filter substrate fabricated according to the above-described method, the base of the columnar spacer on a protection layer covering the color filter substrate is flat. Thus, the flatness of the base of the columnar spacer is improved, the effect of the shape and surface morphology of the color filter layer on the columnar spacer is reduced and a greater design room for the columnar spacer is provided.

According to the embodiments of the disclosure, by designing the structure of the mask for forming color filter layer used in the fabrication process of the color filter substrate, the light regulating structure is provided in the mask for forming color filter layer and the transmittance of the light regulating structure decreases progressively from both sides to the center. Thus, the flatness of the base of the columnar spacer is improved, the difference between the actual shape of the columnar spacer and the design thereof due to the unevenness of the base is eliminated, the support effect of the columnar spacer is improved after the color filter substrate and the array substrate are assembled and the display quality is improved.

According to the embodiments of the disclosure, the flatness of the base of the columnar spacer is improved, the effect of position and size of the columnar spacer on the shape of the columnar spacer is reduced, and the design room for the columnar spacer is enhanced.

The foregoing embodiments merely are exemplary embodiments of the disclosure, and not intended to define the scope of the disclosure. An ordinarily skilled in the art can also make various variation and transformation within the spirit and scope of the disclosure; therefore, all the equivalent technical solutions also belong to the scope of the disclosure, and the protection scope of the disclosure is determined by the appended claims.

What is claimed is:

1. A mask for forming color filter layer used in a fabrication process of a color filter substrate, wherein
a light regulating structure is disposed in a portion of a transparent region of the mask for forming color filter layer, and the light regulating structure is disposed at a position corresponding to a base of a columnar spacer above the color filter layer,
the light regulating structure has a portion which is translucent and is directly opposite to a center portion of the columnar spacer.

2. The mask for forming color filter layer used in the fabrication process of the color filter substrate according to claim 1, wherein
the light regulating structure is a slit structure, the slit structure comprises one slit or a plurality of slits disposed parallel to each other, and each slit is provided in a direction perpendicular to a length direction of the transparent region.

3. The mask for forming color filter layer used in the fabrication process of the color filter substrate according to claim 2, wherein
in the case that the slit structure comprises three or more slits and photoresist for forming the color filter layer is a negative photoresist, a slit width from both sides to a center of the light regulating structure decreases progressively, and/or a distance between the slits increases progressively from both sides to the center of the light regulating structure.

4. The mask for forming color filter layer used in the fabrication process of the color filter substrate according to claim 2, wherein
in the case that the slit structure comprises three or more slits and photoresist for forming the color filter layer is a positive photoresist, the slit width from both sides to a center of the light regulating structure increases progressively, and/or the distance between the slits decreases progressively from both sides to the center of the light regulating structure.

5. The mask for forming color filter layer used in the fabrication process of the color filter substrate according to claim 1, wherein
the light regulating structure is a translucent film structure.

6. The mask for forming color filter layer used in the fabrication process of the color filter substrate according to claim 5, wherein
in the case that photoresist for forming the color filter layer is a negative photoresist, a transmittance of the translucent film structure decreases progressively from both sides to a center along a length direction of the transparent region, or
in the case that photoresist for forming the color filter layer is a positive photoresist, a transmittance of the translucent film structure increases progressively from both sides to the center along the length direction of the transparent region.

7. A method for fabricating a color filter substrate by using the mask for forming color fitter layer according to claim 1, comprising steps of:
S1: in an exposure process of the color filter layer, regulating an exposure degree of a portion of the color filter layer corresponding to the base of the columnar spacer by the light regulating structure in the mask for forming color filter layer, so as to form the color filter substrate.

8. The method for fabricating the color filter substrate according to claim 7, wherein, prior to the step S1, the color filter layer is formed on a black matrix in a shape of stripe or island.

9. The method for fabricating the color filter substrate according to claim 7, wherein
in the step S1, the portion of the color filter layer corresponding to the base of the columnar spacer is exposed by a slit structure or a translucent film structure which is provided in the mask for forming color filter layer and corresponds to the base of the columnar spacer.

10. The method for fabricating the color filter substrate according to claim 9, wherein
the slit structure comprises one slit or a plurality of slits disposed parallel to each other, and each slit is provided in a direction perpendicular to a length direction of the transparent region.

11. The method for fabricating the color filter substrate according to claim 10, wherein
in the case that the slit structure comprises three or more slits and photoresist for forming the color filter layer is a negative photoresist, a slit width from both sides to a center of the light regulating structure decreases progressively, and/or a distance between the slits increases progressively from both sides to the center of the light regulating structure.

12. The method for fabricating the color filter substrate according to claim 10, wherein
in the case that the slit structure comprises three or more slits and photoresist for forming the color filter layer is a positive photoresist, the slit width from both sides to a center of the light regulating structure increases progressively, and/or the distance between the slits decreases progressively from both sides to the center of the light regulating structure.

13. The method for fabricating the color filter substrate according to claim 9, wherein
in the case that photoresist for forming the color filter layer is a negative photoresist, a transmittance of the translucent film structure decreases progressively from both sides to a center along a length direction of the transparent region, and
in the case that photoresist for forming the color filter layer is a positive photoresist, a transmittance of the translucent film structure increases progressively from both sides to the center along the length direction of the transparent region.

14. A color filter substrate, comprising a substrate, a black matrix provided on the substrate, a color filter layer provided on the black matrix, a protection layer provided on the color filter layer, and a columnar spacer, wherein
- the columnar spacer is disposed on the protection layer and corresponds to a portion of a gate line on an array substrate, and a base of the columnar spacer on the protection layer is disposed in a flat shape, and
- the protection layer is not flat and a distance from a portion of the protection layer located above the black matrix to the substrate is larger than a distance from other portions of the protection layer to the, substrate.

* * * * *